United States Patent
Marion

(10) Patent No.: US 7,569,940 B2
(45) Date of Patent: Aug. 4, 2009

(54) METHOD AND DEVICE FOR CONNECTING CHIPS

(75) Inventor: Francois Marion, Saint-Martin-le-Vinoux (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/577,142

(22) PCT Filed: Oct. 28, 2004

(86) PCT No.: PCT/FR2004/050549

§ 371 (c)(1), (2), (4) Date: Apr. 26, 2006

(87) PCT Pub. No.: WO2005/045934

PCT Pub. Date: May 19, 2005

(65) Prior Publication Data

US 2007/0111567 A1    May 17, 2007

(30) Foreign Application Priority Data

Nov. 3, 2003   (FR) .................................. 03 50774

(51) Int. Cl.
   *H01L 23/52*   (2006.01)
   *H01L 23/48*   (2006.01)
   *H01L 29/40*   (2006.01)

(52) U.S. Cl. .................. 257/784; 257/E21.511; 257/685; 257/686; 257/777; 438/108; 438/109

(58) Field of Classification Search .......... 257/E31.117, 257/E31.111, E23.012, 666, 690, 692–696, 257/686, 777, 778, 781, E21.511, E21.519, 257/E23.133, E27.15, 685; 438/108, 109

See application file for complete search history.

(56) References Cited

U.S. PATENT DOCUMENTS

| | | | | |
|---|---|---|---|---|
| 4,743,868 A * | 5/1988 | Katoh et al. | ................ | 333/12 |
| 5,224,021 A * | 6/1993 | Takada et al. | ................ | 361/774 |
| 5,375,041 A * | 12/1994 | McMahon | ................ | 361/749 |
| 5,396,104 A * | 3/1995 | Kimura | ................ | 257/784 |
| 5,601,459 A * | 2/1997 | Seidler | ................ | 439/876 |
| 5,635,718 A * | 6/1997 | DePuydt et al. | ........ | 250/370.09 |
| 5,646,446 A | 7/1997 | Nicewarner et al. | ......... | 257/723 |
| 5,777,391 A | 7/1998 | Nakamura et al. | ......... | 257/778 |
| 5,895,970 A * | 4/1999 | Miyoshi | ................ | 257/696 |
| 6,151,220 A * | 11/2000 | Sakamoto et al. | ........... | 361/773 |
| 6,232,655 B1 * | 5/2001 | Sugimura | ................ | 257/690 |
| 6,441,476 B1 * | 8/2002 | Emoto | ................ | 257/686 |

(Continued)

FOREIGN PATENT DOCUMENTS

EP    0 544 915    6/1993

(Continued)

*Primary Examiner*—Chris C Chu
(74) *Attorney, Agent, or Firm*—Oblon, Spivak, McClelland, Maier & Neustadt, P.C.

(57) ABSTRACT

The invention relates to an electronic device comprising:
   a circuit, comprising a first and a second face, the first face being provided with electrical connection means,
   a transfer element, comprising a first face and a second face, and being assembled to the second face of the active element through its first face, and comprising electrical connection means on its second face,
   a connection between the electrical connection means of the active element and the electrical connection means of the transfer element.

23 Claims, 4 Drawing Sheets

U.S. PATENT DOCUMENTS

| | | | | |
|---|---|---|---|---|
| 6,444,921 | B1 * | 9/2002 | Wang et al. | 174/260 |
| 6,486,544 | B1 * | 11/2002 | Hashimoto | 257/686 |
| 6,507,106 | B1 | 1/2003 | Hoegerl | 257/723 |
| 6,670,700 | B1 * | 12/2003 | Hashimoto | 257/686 |
| 6,835,598 | B2 * | 12/2004 | Baek et al. | 438/109 |
| 6,924,551 | B2 * | 8/2005 | Rumer et al. | 257/688 |
| 6,940,729 | B2 * | 9/2005 | Cady et al. | 361/767 |
| 2002/0106833 | A1 | 8/2002 | Kobayashi | 438/108 |
| 2002/0160598 | A1 | 10/2002 | Kong | 438/613 |

FOREIGN PATENT DOCUMENTS

JP 60-30171 2/1985

\* cited by examiner

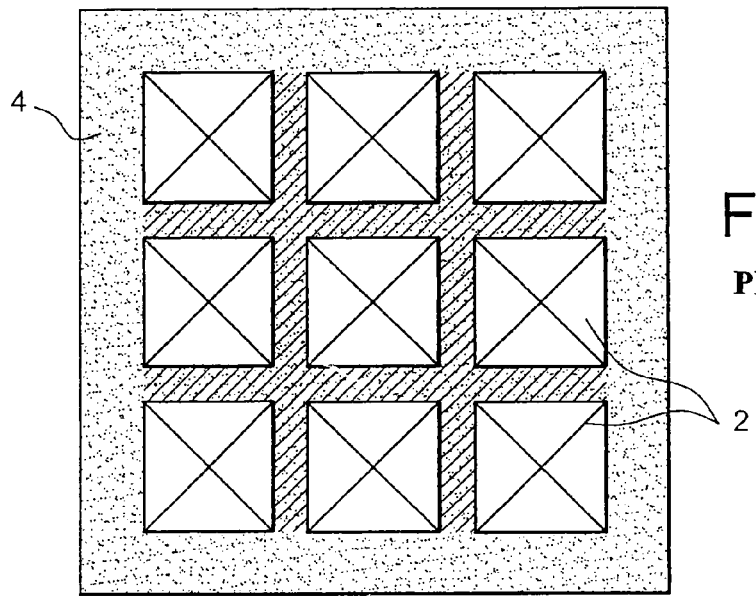
FIG. 1A
PRIOR ART
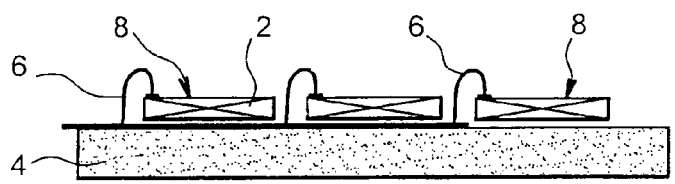
FIG. 1B
PRIOR ART
FIG. 1C PRIOR ART
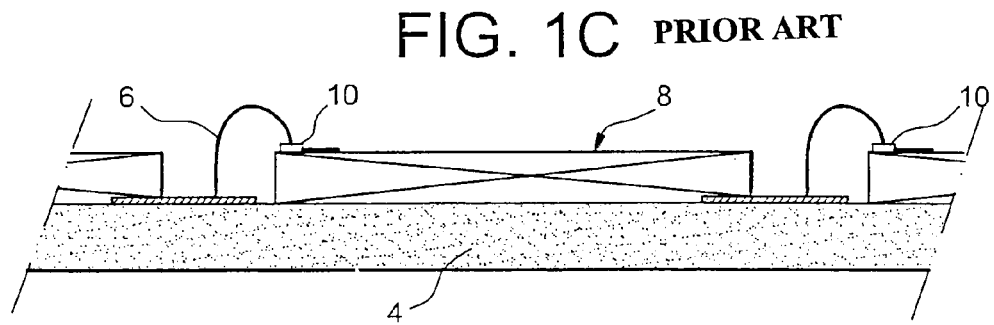

METHOD AND DEVICE FOR CONNECTING CHIPS

TECHNICAL DOMAIN AND PRIOR ART

The technical domain of this invention is microelectronics or optoelectronics and more specifically manufacturing of microelectronic and optoelectronic components and their external connection means (inputs/outputs).

The invention may be applied to all sorts of devices requiring a dense interconnection of several electronic chips on a small area interconnection support.

One application is to bring several components to put them side by side or adjacent, for example for large imagers or large screens. For example, the invention can also be used to put components side by side with a minimum loss of pixels limited to one side.

Another application relates to putting ink injection chips side by side for printers or other electronic components.

For example, when it is required to make very large radiation detection matrices (visible, IR, UV, X, gamma radiation, millimetric radiation, etc. . . . ) or emission or imagery matrices (screens, LED emitting matrices, VCSEL laser, etc.), several elementary components 2 are put side by side and interconnected on a common support 4 (like paving), as illustrated in FIGS. 1A and 1B.

An attempt is made to minimize lost areas (shown cross-hatched in FIG. 1A) located between the elementary components 2.

Each elementary component needs external physical <<electrical inputs>> 6 to its active face 8 (FIG. 1B).

These inputs generally originate from the interconnection substrate 4 onto which the components are transferred.

Therefore the inputs must transit from the upper face 8 of each component to the support 4.

As illustrated in FIGS. 1B and 1C, this transit is usually made using solder wires 6 soldered firstly to thermocompression pads 10 on the front of the component, and secondly onto the interconnection support 4.

The side areas necessary for this operation (cross-hatched areas in FIG. 1A) are very large and in particular cause the loss of a significant number of detection or emission pixels in areas near the contact boundary.

Document US.2002/0160598 describes a method of interconnection passing through a silicon chip, to reduce the size of these lost areas.

However, this technique is extremely complex and it can only be used on complete silicon circuit wafers (200 mm, 300 mm). Furthermore, this technique is unsuitable for production on a single chip cut out from a wafer or substrate.

Nor can such a technique be applied, for example, to foundry batches shared by several users.

PRESENTATION OF THE INVENTION

The invention relates to an electronic device comprising:
- an active element or a circuit comprising a first and a second face, the first face being provided with electrical connection means,
- an element or a circuit, or transfer elements, comprising a first face and a second face and being assembled to the second face of the active element through its first face, and electrical connection means on its second face,
- a preferably wire connection between the electrical connections of the active element or the circuit and the transfer element.

Since connections are provided on the transfer element, a connection may be made between the first face of the active element and the second face of the transfer element, for example using a wire connection. A <<wire connection>> means any connection using an electrical wire or an electrical strip cable.

Therefore, there is no direct connection to be made between the active element and an assembly circuit or a semiconductor wafer. The transfer element can be fixed on such a wafer or on such an assembly circuit.

The width of the transfer element along a direction perpendicular to one side of the active element on which or close to which electrical connection means are provided, is less than the width of the active element itself. Preferably, the active element is the only element that is transferred onto or is fixed to the transfer element.

This smaller width makes it possible to bring a wire connection from the first face of the active element towards the second face of the transfer element or circuit, but below the active element.

This transfer element may be made of any material, for example silicon or ceramic. It may be configured as required, for example it may be provided with connection balls or pins or pads that can be interconnected, for example by a conducting anisotropic glue.

Furthermore, a device according to the invention can be manufactured using simple techniques with less expensive equipment than is normally used.

The circuit may comprise an electronic circuit, for example a semiconductor circuit such as a CMOS or CCD circuit, or an interconnections network, or a bipolar circuit.

Radiation detection or emission devices or means, and/or possibly mechanical or electromechanical devices or means, may be integrated into or hybridized onto the circuit or the electronic circuit. Examples of mechanical devices include MEMS (microelectromechanical systems), for example such as one or more micro-mirrors and/or bolometers and/or one or more force sensors. These electronic means or devices may be integrated into the circuit and/or hybridized on the first face of the circuit.

The invention also relates to an electronic system comprising a plurality of such devices. Each transfer element in each of these devices is connected or fixed to a common substrate through connection balls or pins or pads.

The invention also relates to a method of manufacturing a device, for example an electronic device, comprising:
- the assembly of a circuit or an active circuit comprising a first and a second face, the first face being provided with means of making an electrical connection with a transfer element comprising a first face and a second face and electrical connection means on its second face, the assembly being made through its first face to the second face of the active element, the transfer element being designed to be assembled to another circuit or to a semiconductor wafer on the side of this second face,
- making a connection, preferably a wire connection, between the electrical connection means of the active element or circuit and the transfer element.

This method can also be used to make a protection layer for the connection.

Assembly of the circuit and the transfer element may include the formation of a layer of glue or a glue film or a glue strip or soldering means on one and/or the other of the two faces of the circuit and the transfer element to be assembled together.

BRIEF DESCRIPTION OF THE FIGURES

FIGS. 1A to 1C show devices according to prior art.

DESCRIPTION OF EMBODIMENTS OF THE INVENTION

Figure 2A:
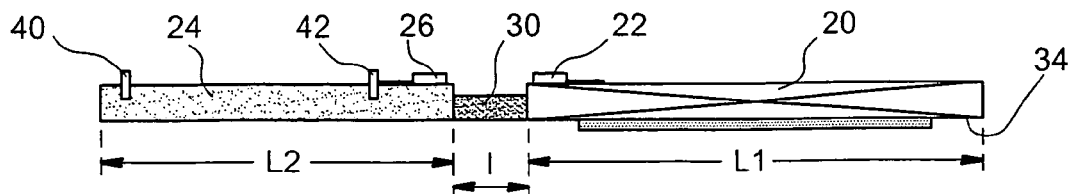
FIGS. 2A to 2D show the steps in a method according to the invention.

A first embodiment of the invention is described with reference to FIGS. 2A to 2D.

The component 20 to be interconnected through the rear face is provided with electrical connection means 22, for example one or several thermocompression pads, on one of its sides. The thickness of the component is E2.

This component 20 is generally in the shape of a quadrilateral, as illustrated in FIG. 1A, with its width L1 along a direction perpendicular to the side on which the connection means 22 are provided.

An intermediate or transfer element 24 is made separately, with thickness E1. This element 24 may for example be a single or multilayer ceramic, or a printed circuit.

The shape of this intermediate element is usually similar to the shape of the component 20. Its width in a direction perpendicular to the side of the component 20 on which the connection means 22 are located is equal to L2, and preferably L2<L1.

It also comprises connection means, for example one or several pads 26, on one of its surfaces.

These pads may be connected to interconnection tracks that redistribute each pad 26 to balls (BGA type connection) or pins 40, 42 (PGA type connection) distributed over the surface of the element 24.

Thus, the intermediate or transfer element 24 can be assembled to another support such as a semiconductor circuit or wafer, on the side of this surface on which the connection means are located.

The component 20 and the intermediate element 24 are put side by side, with the connection means 22, 26 facing each other. A spacer 30 with width 1 greater than E1+E2 can possibly be used to maintain a spacing of width 1 between the component 20 and the element 24 while the connection is being made.

The electrical connection wires 32 are then placed between the connection means of the component 20 and the connection means of the intermediate element 24.

Figure 2B:
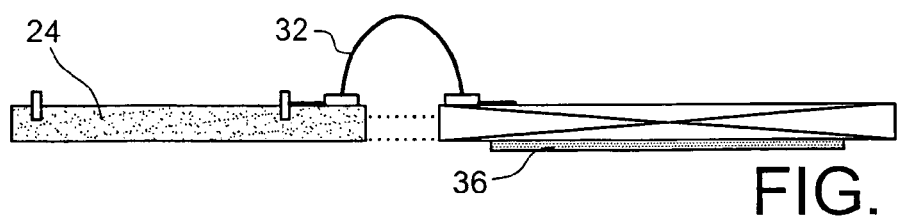
Figure 2C:
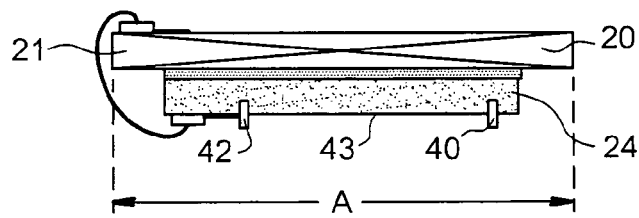
Figure 2D:
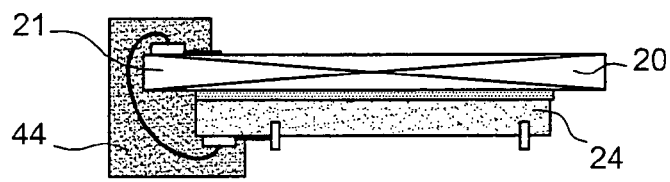

The back face 34 of one of the two components is prepared for subsequent gluing or soldering, for example by depositing a layer of glue or solder or a dry film, or a double sided gluing strip, etc. In FIG. 2B, the reference 36 denotes an example of a glue layer.

In the next step (FIG. 2C), the intermediate element is turned by 180° folding it down under the component 20 (advantageously after the spacer 30 has been eliminated) and the connection between the component 20 and the intermediate element 24 is terminated by cross linking of the deposited glue or remelting of the solder or another attachment mode.

The two initial elements are then bonded together, the new created component comprising electrical inputs/outputs 40, 42 on the back face 43, for example distributed in two-dimensional space on the free face of element 24.

Therefore the wire connections 32 are connected firstly to the top surface of the component 20, and secondly to the surface 43 of the element 24. Therefore, the ends of these connections on the element 24 are located in an area A located under the component 20 or delimited by this component 20. Therefore, each wire 32 can pass close to the side or the edge 21 of the component 20. Therefore the lateral extension of the wire connection is much less than it was in prior art as illustrated in FIG. 1C.

It would be possible to shape the connection wires (for example by pressing, etc.). The side passage of the wires can then be protected 44, for example by encapsulation, by gluing or by a deposit (for example of parylene).

Figure 3:
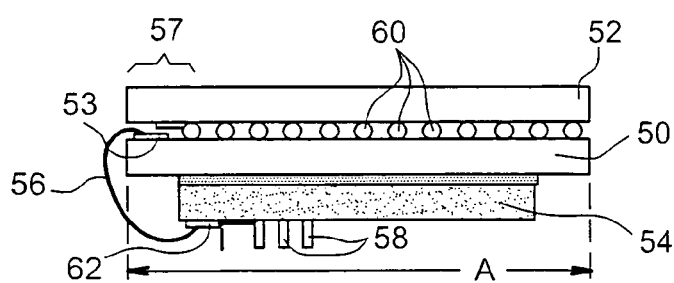
FIG. 3 shows an example embodiment of a device according to the invention.

FIG. 3 illustrates one example embodiment; it relates to the production of components for detection of photons, several of these components designed to be put side by side to form a detection matrix. For example, each elementary component may include 100*100 pixels each 200 µm square (therefore each with a surface area of 200 µm×200 µm). A pixelized detection circuit 52 is hybridized onto a CMOS read circuit 50 mounted on an intermediate element 54 provided with connection means, for each component.

The first step is to make a <<composite>> circuit composed of the CMOS circuit 50 and the intermediate element 54.

The CMOS circuit 50 is cut to 20 µm from the edge of the active circuits on three sides and 80 µm from the first active pixel on the fourth side on which the connection pads 53, for example thermocompression pads, are located. For example, the size of this circuit could be 20.04 mm by 20.1 mm.

A ceramic ($Al_2O_3$ or AlN ...) type of intermediate element 54 is provided with assembly means 58 for a printed circuit. For example, these means may be pins and they make the element 54 connectable and disconnectable. Connection pads 62 will be used to fix a connection wire 56 to electrically connect them to the pads 53.

The ceramic 54 is preferably smaller than the circuit 50, for example its size is 1.8 mm×1.8 mm.

The steps described above are described with reference to FIGS. 2A to 2D, using thicknesses E1 and E2 equal to 500 µm, a 1.1 mm wide shim 30, a 25 µm connection wire 56 and a parylene deposit 44 for final coating of the wire 56.

The characteristics of the composite circuit will be as follows:
  on three sides: another circuit can be placed adjacent to this circuit at a distance of about 20 µm,
  on the side of the circuit 50 on which the wires 56 are located: another circuit can be placed adjacent to this circuit at a distance of about 130 µm: 80 µm (width of connection pad 53)+25 µm (thickness of wire 56)+15 µm (clearance width)+10 µm (thickness of parylene).

Therefore, the active circuits can be put side by side on three of the four sides, at a minimum distance of 2*20=40 µm, and on the other side at a minimum distance of 20+130=150 µm.

The active circuit 50 may for example be provided with connection balls 60 distributed at a pitch of 200 µm on which a photon detection circuit 52 is deposited cutout so that it only loses 0.5 pixels on each of the four sides.

The detector circuit 52 passes above the wires 56. Thus, only one row of pixels is lost close to the junction in the region 57.

Therefore, another wire connection with a very limited lateral extension is made, the assembly means being brought to or located in the area A located under the component 50.

The next step is to make an assembly by the insertion of pins 58 in a support circuit or by soldering balls if balls are used instead of the pins 58.

The support circuit can be paved by simple insertion of elements like that shown in FIG. 3. Repairs are made by removing one defective element and then reinserting a new element.

Figure 4A:
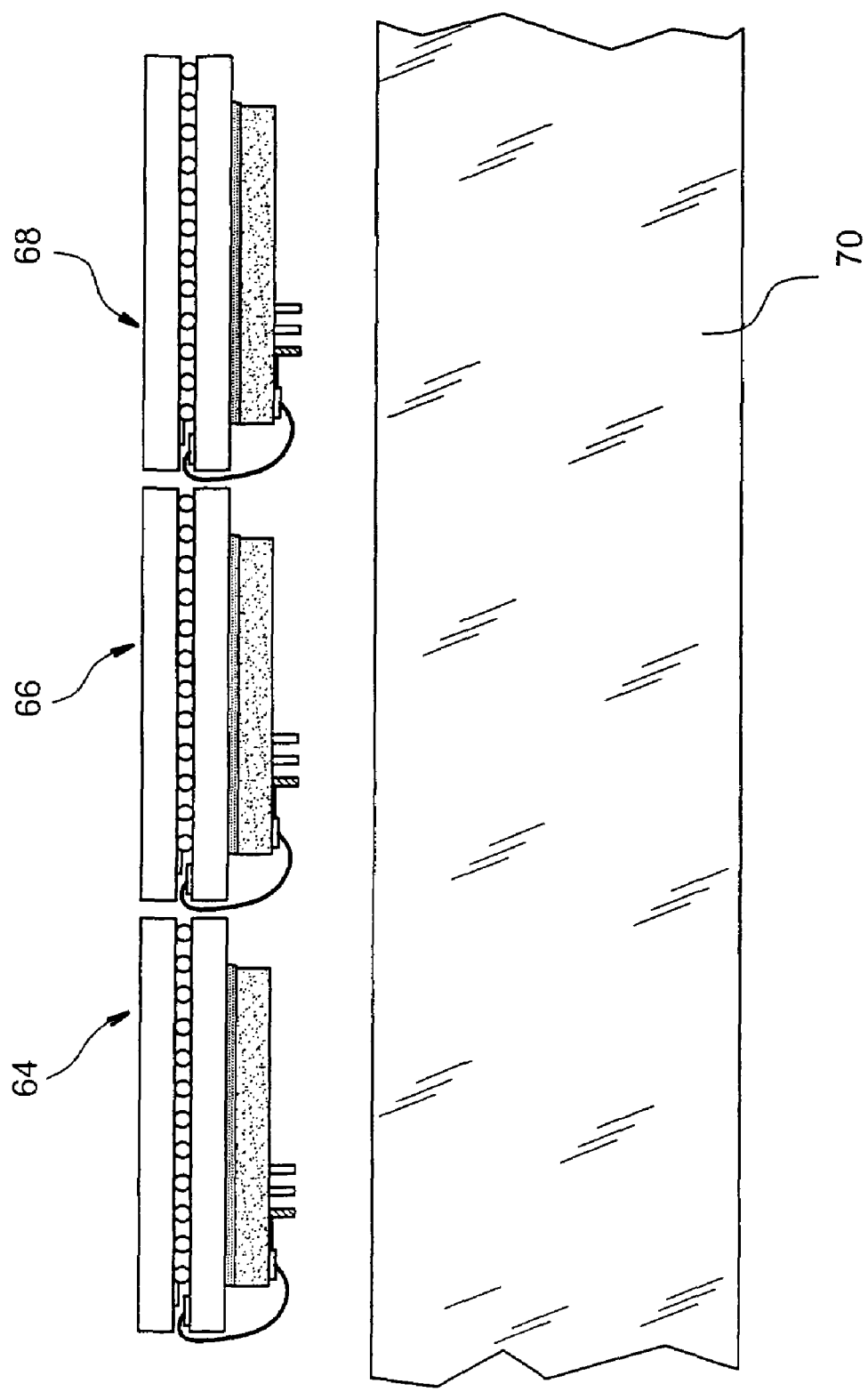
FIGS. 4A and 4B show assembled systems of devices according to the invention.
Figure 4B:
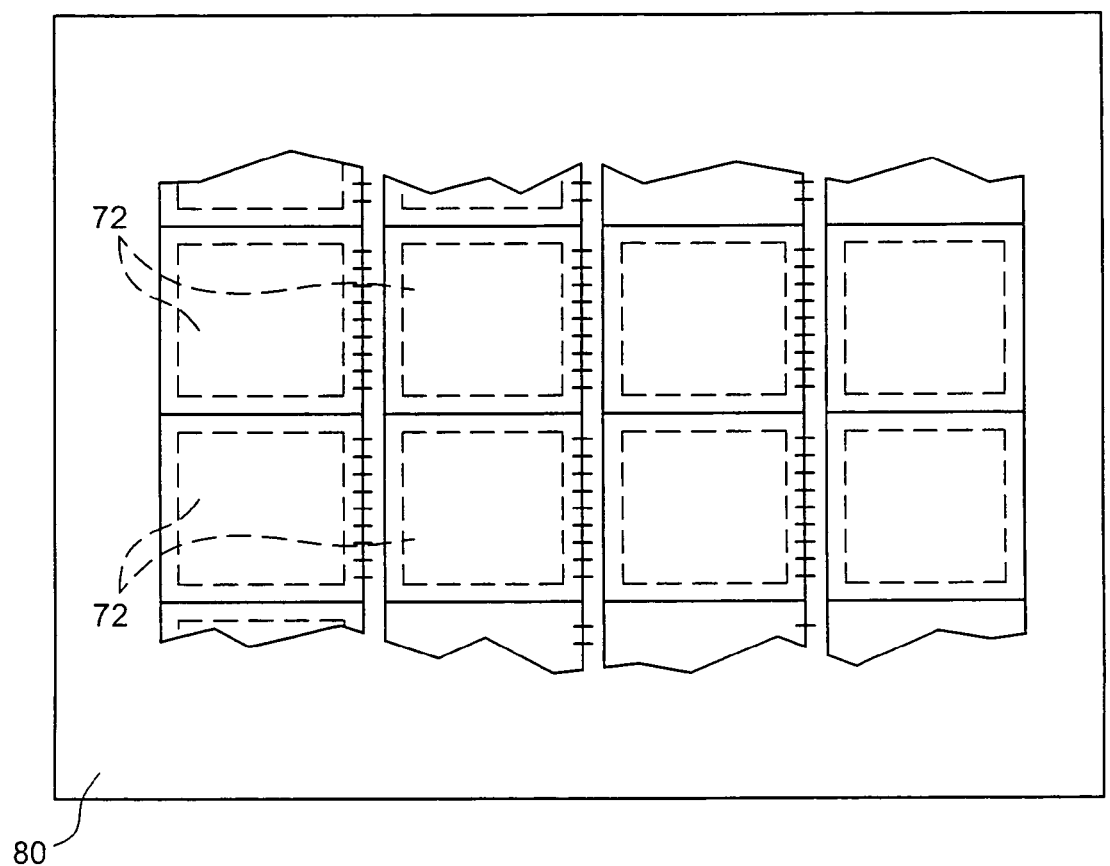

FIGS. 4A and 4B show paving that can be obtained.

FIG. 4A shows several elementary components 64, 66 and 68 of the type described above with reference to FIG. 3, to be assembled on a circuit 70 or a silicon substrate.

FIG. 4B shows a top view of components, for example detectors 72, each being assembled with a corresponding intermediate element (shown in dashed lines), itself assembled to or fixed to a circuit or substrate 80 common to all detectors.

The invention limits losses in areas near the contact boundary, to a single row of pixels (namely a dead area about 200 μm wide). This numeric example ignores positioning tolerance conditions on the printed circuit.

According to the invention, an intermediate element can be transferred on the back face of a chip and the chip inputs/outputs are connected to the back of the chip/intermediate element assembly. This facilitates the connection of this assembly and can increase the integration density.

Other elements can be associated with each chip, for example hybridized on its front face.

The invention is applicable to the manufacture of large detectors, particularly infra-red detectors, bolometric detectors that can be put side by side, X-ray scanners or large gamma ray detectors. Large emission screens can also be made.

I claim:

1. An electronic device comprising:
    a) an active element, comprising a semiconductor component comprising at least one of a photon or radiation detector, a photon or radiation emission device, and a MEMS, said active element having a first and a second face, the first face being provided with electrical connections, arranged on one side only of said active element;
    b) a transfer element, comprising a first face and a second face and being assembled to the second face of the active element through its first face, and having electrical connections on its second face, this transfer element being assembled on a surface of another circuit on the side of its second face such that the second face of the transfer element is parallel to the surface of the another circuit; and
    c) at least one wire connection between the electrical connections of the first face of the active element and the second face of the transfer element.

2. The electronic device according to claim 1, the transfer element being assembled to the second face of the active element by a layer of glue, a glue film, a glue strip, or soldering means.

3. The electronic device according to claim 1, the wire connection being covered by a protection layer.

4. The electronic device according to claim 1, the transfer element further comprising a ceramic element.

5. The electronic device according to claim 1, said active element comprising at least one of a CMOS circuit, a CCD circuit, and a bipolar circuit.

6. The electronic device according to claim 1, further comprising:
    a photon or radiation detector, or a photon or radiation emission device, hybridized onto the first face of said active element.

7. The electronic device according to claim 1, further comprising:
    a mechanical or electromechanical device, or a MEMS, hybridized on the first face of said active element.

8. The electronic device according to claim 6 or 7, wherein a single element hybridized on the first face of said active element covers all of the electrical connections located on said first face of said active element.

9. The electronic device according to claim 1, the second face of the transfer element further comprising connection balls, pins, or pads.

10. An electronic system comprising:
    one or more electronic devices according to claim 9, each transfer element in the one or more electronic devices being connected or fixed to a common substrate through connection balls, pins, or pads.

11. The electronic system according to claim 10, each electronic device being separated from a neighboring electronic device by a distance of less than 60 μm.

12. The electronic device according to claim 1, wherein the transfer element is configured to connect the active element to the another circuit such that the active element does not have a direct connection to the another circuit.

13. An electronic device comprising:
    a) an active element, comprising a semiconductor component, said active element having a first and a second face, the first face being provided with electrical connections, arranged on only one side of said active element;
    b) a transfer element, comprising a first face and a second face and being assembled to the second face of the active element through its first face, and having electrical connections on its second face, the transfer element being assembled on a surface of another circuit on the side of its second face such that the second face of the transfer element is parallel to the surface of the another circuit;
    c) at least one of:
    a photon or radiation detector,
    a photon or radiation emission device, and
    a MEMS,
    being hybridized onto the first face of said active element; and
    d) at least one wire connection between the electrical connections of the first face of the active element and the second face of the transfer element.

14. The electronic device according to claim 13, the transfer element being assembled to the second face of the active element by a layer of glue, a glue film, a glue strip, or soldering means.

15. The electronic device according to claim 13, said wire connection being covered by a protection layer.

16. The electronic device according to claim 13, the transfer element further comprising a ceramic element.

17. The electronic device according to claim 13, said active element comprising at least one of a CMOS circuit, a CCD circuit, and a bipolar circuit.

18. The electronic device according to claim 13, said active element further comprising at least one of a photon or radiation detector, a photon or radiation emission device, a mechanical means, a electromechanical means, and a MEMS.

19. The electronic device according to claim 13, said at least one of a photon or radiation detector, a photon or radiation emission device, and a MEMS, hybridized on said first face of said active element, covering the electrical connections located on said first face.

20. The electronic device according to claim 13, said second face of the transfer element further comprising connection balls, pins, or pads.

21. An electronic system comprising:
one or more electronic devices according to claim 13, each transfer element in the one or more electronic devices being connected or fixed to a common substrate through connection balls, pins, or pads.

22. The electronic system according to claim 13, each electronic device being separated from a neighboring electronic device by a distance of less than 60 μm.

23. An electronic device comprising:
a) an active element, comprising a semiconductor component, said active element having a first and a second face, the first face being provided with electrical connections, arranged on only one side of said active element;
b) a transfer element, comprising a first face and a second face and being assembled to the second face of the active element through its first face, and having electrical connections on its second face, the transfer element being assembled on a surface of another circuit on the side of its second face such that the second face of the transfer element is parallel to the surface of the another circuit;
c) at least one of:
a photon or radiation detector,
a photon or radiation emission device, and
a MEMS,
being hybridized onto the first face of said active element and covering at least part of said electrical connections of said first face of said active element; and
d) at least one wire connection between the electrical connections of said first face of said active element and said second face of said transfer element.

* * * * *